(12) United States Patent
Gonzales, Jr.

(10) Patent No.: US 12,332,286 B2
(45) Date of Patent: *Jun. 17, 2025

(54) METHODS, SYSTEMS AND APPARATUS FOR POWER MONITORING

(71) Applicant: eBay Inc., San Jose, CA (US)

(72) Inventor: Sergio Pinzon Gonzales, Jr., San Jose, CA (US)

(73) Assignee: EBAY INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/968,770

(22) Filed: Oct. 18, 2022

(65) Prior Publication Data

US 2023/0041376 A1    Feb. 9, 2023

Related U.S. Application Data (63) Continuation of application No. 17/089,188, filed on Nov. 4, 2020, now Pat. No. 11,500,000, which is a continuation of application No. 16/665,998, filed on Oct. 28, 2019, now Pat. No. 10,866,268, which is a continuation of application No. 14/486,011, filed on Sep. 15, 2014, now Pat. No. 10,495,673.

(51) Int. Cl.
*G01R 21/133* (2006.01)

(52) U.S. Cl.
CPC .................. *G01R 21/133* (2013.01)

(58) Field of Classification Search
CPC .............................................. G01R 21/133
USPC ........................................................ 702/61
See application file for complete search history.

(56) References Cited

U.S. PATENT DOCUMENTS

| | | | |
|---|---|---|---|
| 8,380,999 B1 * | 2/2013 | Robison | H04W 52/0274 320/120 |
| 9,013,283 B1 | 4/2015 | Tackaberry | |
| 10,495,673 B2 * | 12/2019 | Gonzales, Jr. | G01R 21/133 |
| 11,500,000 B2 * | 11/2022 | Gonzales, Jr. | G01R 21/133 |
| 2009/0195349 A1 * | 8/2009 | Frader-Thompson | G01D 4/002 340/3.1 |
| 2010/0305890 A1 | 12/2010 | Huang | |
| 2012/0089269 A1 * | 4/2012 | Weaver | H04W 74/00 700/295 |
| 2012/0278014 A1 | 11/2012 | Davies | |

(Continued)

FOREIGN PATENT DOCUMENTS

| | | | | |
|---|---|---|---|---|
| CA | 2697991 C | * | 5/2018 | G06F 1/3203 |
| WO | WO-2012128912 A2 | * | 9/2012 | G01R 21/00 |

OTHER PUBLICATIONS

Shin et al., DE 102012201206 A1, "Electrical Device, Energy Management Device and Method of Controlling Same", published Feb. 8, 2012 (Year: 2012).*

(Continued)

*Primary Examiner* — John H Le
(74) *Attorney, Agent, or Firm* — SCHWEGMAN LUNDBERG & WOESSNER, P.A.

(57) ABSTRACT

Methods, systems, and apparatus for receiving one or more power usage measurements for a set of elements, determining a user behavior based at least on an analysis of the one or more power usage measurements of at least one of the set of elements, and based on a determined user behavior, causing the at least one of the set of elements to perform an action that affects a power function of the at least one of the set of elements.

18 Claims, 7 Drawing Sheets

(56) References Cited

U.S. PATENT DOCUMENTS

| | | |
|---|---|---|
| 2015/0257109 A1 | 9/2015 | Koullias et al. |
| 2016/0077139 A1 | 3/2016 | Gonzales, Jr. et al. |
| 2018/0032997 A1* | 2/2018 | Gordon .............. G06Q 30/0269 |
| 2020/0057099 A1 | 2/2020 | Gonzales, Jr. |
| 2021/0048460 A1 | 2/2021 | Gonzales, Jr. |

OTHER PUBLICATIONS

"U.S. Appl. No. 14/486,011, Non Final Office Action mailed Jan. 27, 2017", 11 pgs.

"U.S. Appl. No. 14/486,011, Examiner Interview Summary mailed Feb. 24, 2017", 10 pgs.

"U.S. Appl. No. 14/486,011, Final Office Action mailed Apr. 13, 2017", 19 pgs.

"U.S. Appl. No. 14/486,011, Examiner Interview Summary mailed Jun. 22, 2017", 4 pgs.

"U.S. Appl. No. 14/486,011, Non Final Office Action mailed Jul. 28, 2017", 19 pgs.

"U.S. Appl. No. 14/486,011, Examiner Interview Summary mailed Aug. 17, 2017", 3 pgs.

"U.S. Appl. No. 14/486,011, Final Office Action mailed Nov. 2, 2017", 14 pgs.

"U.S. Appl. No. 14/486,011, Examiner Interview Summary mailed Dec. 26, 2017", 3 pgs.

"U.S. Appl. No. 14/486,011, Non Final Office Action mailed Mar. 8, 2018", 15 pgs.

"U.S. Appl. No. 14/486,011, Examiner Interview Summary mailed Jun. 21, 2018", 4 pgs.

"U.S. Appl. No. 14/486,011, Final Office Action mailed Aug. 1, 2018", 12 pgs.

"U.S. Appl. No. 14/486,011, Non Final Office Action mailed Dec. 13, 2018", 15 pgs.

"U.S. Appl. No. 14/486,011, Final Office Action mailed Mar. 28, 2019", 9 pgs.

"U.S. Appl. No. 14/486,011, Notice of Allowance mailed Aug. 16, 2019", 8 pgs.

"U.S. Appl. No. 16/665,998, Non Final Office Action mailed Apr. 2, 2020", 15 pgs.

"U.S. Appl. No. 16/665,998, Examiner Interview Summary mailed Jun. 22, 2020", 3 pgs.

"U.S. Appl. No. 16/665,998, Final Office Action mailed Jul. 23, 2020", 11 pgs.

"U.S. Appl. No. 16/665,998, Notice of Allowance mailed Aug. 20, 2020", 8 pgs.

"U.S. Appl. No. 17/089,188, Non Final Office Action mailed Mar. 29, 2022", 15 pgs.

"U.S. Appl. No. 17/089,188, Examiner Interview Summary mailed Jun. 20, 2022", 2 pgs.

"U.S. Appl. No. 17/089,188, Notice of Allowance mailed Jul. 12, 2022", 8 pgs.

* cited by examiner

| 308 | 312 | 316 | 318 |
|---|---|---|---|
| RULE 1 | COFFEE MAKER | DURATION OF POWER USAGE AT HIGH POWER RATING > 300 MIN. | RECOMMEND PURCHASE OF COFFEE |
| RULE 2 | HAIR DRYER | DURATION OF POWER USAGE AT 1500 W EXCEEDS POWER USAGE AT 750 W | RECOMMEND BRAND X HAIR PRODUCTS |
| RULE 3 | TELEVISION/ HOME THEATRE SYSTEM/ LIGHTS | TELEVISION POWER USAGE EXCEEDS 50 W, HOME THEATRE SYSTEM POWER USAGE EXCEEDS 75 W & LIGHTS ARE DIMMED (200 W) | LOG MOVIE IN PROGRESS |

*FIG. 3*

| 408 | 412 | 416 |
|---|---|---|
| 4729834 | TOASTER | T105 |
| 4729835 | 100 W LAMP AND BRAND X, MODEL Y TELEVISION | T106 |
| 8787244 | COFFEE MAKER | T107 |
| 9678445 | REFRIGERATOR | T108 |

*FIG. 4A*

| 458 | 462 |
|---|---|
| 12:27:00 | 550 W |
| 12:37:05 | TRANSITION TO 100 W |
| 2:18:30 | TRANSITION TO 0 W |

METHODS, SYSTEMS AND APPARATUS FOR POWER MONITORING

CROSS-REFERENCE TO RELATED APPLICATIONS

The present application is a continuation of and claims the benefit of priority to U.S. Application Ser. No. 17/089,188, filed Nov. 4, 2020, which is a continuation of and claims the benefit of priority to U.S. application Ser. No. 16/665,998, filed Oct. 28, 2019, which is a continuation of U.S. application Ser. No. 14/486,011, filed Sep. 15, 2014, each of which is hereby incorporated by reference in its entirety.

TECHNICAL FIELD

The present application relates generally to monitoring power consumption, and more specifically, in one example, to monitoring power usage of a device to determine ancillary information and corresponding actions and/or recommendations.

BACKGROUND

Power monitoring may be used to measure the quality and quantity of power consumed by home appliances, consumer electronic devices, industrial machinery, and the like. The power measurements may be based on a duration of use and a magnitude of power consumed. The measurements may be used in applications such as energy conservation, the generation of invoices by utility companies, the detection of the usage of an appliance, and the like.

BRIEF DESCRIPTION OF THE DRAWINGS

Some embodiments are illustrated by way of example and not limitation in the figures of the accompanying drawings in which.

DETAILED DESCRIPTION

In the following detailed description of example embodiments of the invention, reference is made to specific examples by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the scope or extent of the present invention. Features or limitations of various embodiments of the invention described herein, however essential to the example embodiments in which they are incorporated, do not limit the invention as a whole, and any reference to the invention, its elements, operation, and application do not limit the invention as a whole but serve only to define these example embodiments. The following detailed description does not, therefore, limit the scope of the invention, which is defined only by the appended claims.

Generally, methods, apparatus, and systems for monitoring the power consumption of an element, deriving ancillary information based on the monitored power usage, and determining actions and/or recommendations based on the power usage and/or ancillary information, are disclosed. The element may be a component, a device, an appliance, a system or a combination of one or more of a component, a device, an appliance, and a system. An element may be a home appliance, a computer, a mobile device, a personal digital assistant, a set-top box, a tablet computer, a television set, an audio system, a home theater system, a cellular phone, an internet device, a network-based storage device, and the like. A system can be a home ventilation and air conditioning system, a heating system, and the like. The power monitoring may comprise power measurements based on time of use (e.g., morning or evening, time of day, and the like), frequency of use, duration of use, magnitude of power consumed, and the like. Based on one or more power measurements, information, such as the behavior of a user of the element, may be determined, inferred or estimated. Based on the power measurements and/or user behavior, actions may be determined and/or recommendations may be generated. For example, a clothes washing machine may be monitored and a usage of the clothes washing machine may be analyzed to determine if a recommendation to purchase additional laundry supplies should be issued.

Figure 1:
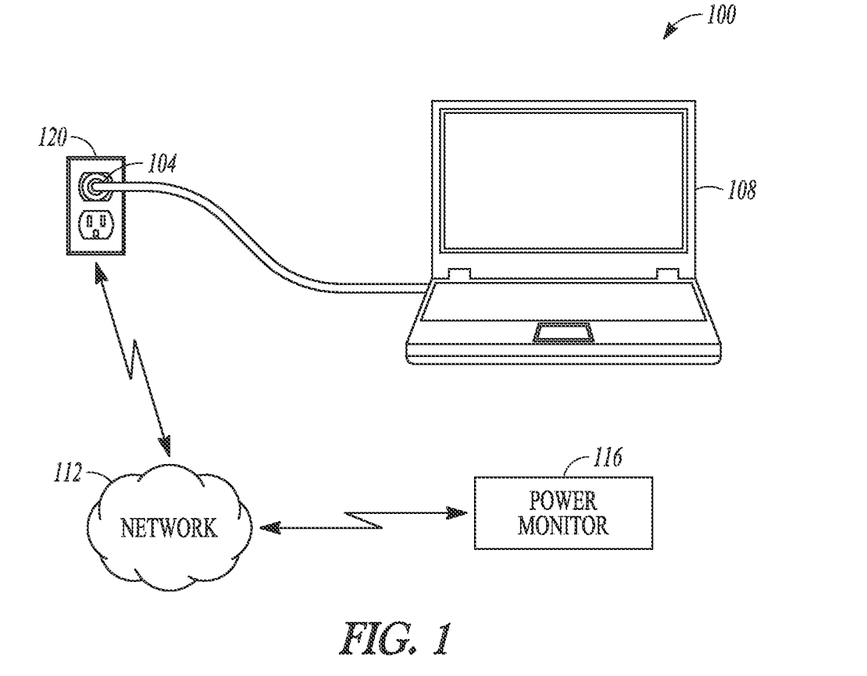
FIG. 1 is a block diagram of an example system for monitoring the power consumption of an element, in accordance with an example embodiment.

FIG. 1 is a block diagram of an example system 100 for monitoring the power consumption of an element, in accordance with an example embodiment. The system 100 may derive ancillary information based on the monitored power usage and may determine actions and/or recommendations based on the power usage and/or ancillary information. In one example embodiment, the system 100 may comprise a power measurement device 104, a monitored element 108, a network 112, and a power monitor 116.

The monitored element 108 may be a component, a device, an appliance, a system or a combination of one or more of a component, a device, an appliance, and a system. As described above, an element may be a home appliance, a computer, a mobile device, a personal digital assistant, a set-top box, a tablet computer, a television set, an audio system, a home theater system, a cellular phone, an internet device, a network-based storage device, and the like, and a system may be a home ventilation and air conditioning system, a heating system, and the like. The power consumption of the monitored element 108 may be monitored and ancillary information, such as user behavior, may be determined, inferred, and/or estimated.

The power measurement device 104 may dynamically measure voltage and/or current and may send the measurements to the power monitor 116. In one example embodiment, the power may be measured periodically, at a prescheduled time, in response to a reception of a measurement request, and/or in response to a substantial change in the power consumption. In one example embodiment, the power measurements may be sent to the power monitor 116 via the network 112. The power measurements may be sent periodically, at a prescheduled time, in response to a reception of a measurement request, and/or in response to a substantial change in the power consumption. In one example embodiment, the power measurement device 104 may be implemented as a dongle, an element of a power cord, an element of a power plug (as shown in FIG. 1), an element of the monitored element 108, a device electrically positioned between a power cord of the monitored element 108 and an electrical power outlet 120, a device electrically positioned between a power cord of the monitored element 108 and an electrical circuit breaker, and the like. The power measurement device 104 may be a portable device that may be installed at different locations.

The electrical power for the monitored element 108 may pass through the power measurement device 104 or may bypass the power measurement device 104. For example, the power measurement device 104 may comprise a split core current transformer that encompasses a power cord supplying power to the monitored element 108. The split core current transformer measures the current flowing through the power cord supplying power to the monitored element 108 without requiring physical contact with the power cord.

In one example embodiment, the power measurement device 104 may communicate externally with, for example, the power monitor 116 via a wireless link (e.g., IEEE 802.11), a wired link (e.g., USB), and the like. The power measurement device 104 may communicate with the power monitor 116 via the network 112. In one example embodiment, the power measurement device 104 may communicate with the power monitor 116 via the power line used to provide power to the monitored element 108 and/or via the power line used to provide power to the power measurement device 104.

The network 112 may be a local area network (LAN), a wireless network, a metropolitan area network (MAN), a wide area network (WAN), a wireless network, a network of interconnected networks, the public switched telephone network (PSTN), an electrical power-based network (such as the X.10 protocol), and the like. Communication links include, but are not limited to, Wi-Fi (e.g., IEEE 802.11), Bluetooth, Universal Serial Bus (USB), and the like. In one example embodiment, the network 112 may comprise one or more routers and/or device switches (not shown).

The power monitor 116 may be implemented on a server, client, or other processing device that includes an operating system for executing software instructions. The power monitor 116 obtains power measurement information from the power measurement device 104 and determines, infers and/or estimates ancillary information, such as user behavior, and generates recommendations and/or identifies actions to be performed based on the power measurement information and/or the ancillary information. In one example embodiment, the power monitor 116 may trigger or execute the identified action. In one example embodiment, the power monitor 116 may be a component of the power measurement device 104.

In one example embodiment, the power monitor 116 may periodically record the power measurement data received from the power measurement device 104 for a period of time. In one example embodiment, the power monitor 116 may record the power measurement data and/or changes in the power measurement data, as described below in conjunction with FIG. 4B. The recording may include a time of the change of the power measurement data.

In one example embodiment, the type of element being monitored may be determined by analyzing the monitored power usage. For example, a home appliance, such as a clothes washing machine, may cycle through different operations that consume different amounts of power. A first cycle may consume 75 watts and may fill the tub with water, a second cycle may consume 800 watts and may rotate the tub to create a washing action, a third cycle may consume 50 watts and may drain the tub of water, a fourth cycle may consume 75 watts and may fill the tub with clean water, a fifth cycle may consume 800 watts and may rotate the tub to create a rinsing action, and a sixth cycle may consume 1000 watts and may spin the tub at a high speed to drain the clothes of water. A time-based record of the power consumed may produce a power signature that may be used to identify the type of appliance as a clothes washing machine by comparing known power signatures with the power signature of the unknown element.

In one example embodiment, power usage data and the derived information, such as user behavior, may be maintained at a central location. In one example embodiment, information derived from the power usage of a plurality of elements may be analyzed to determine ancillary information, including user behavior, as described more fully below. For example, if a kitchen blender, stereo system, and specified lights are determined to be powered-on during the same time period, it may be inferred that a house party is in progress. In another example, the sleeping patterns of a user may be inferred from the power usage of various devices. For example, the power usage of a bedroom lamp and bedroom television may be used to determine the sleeping patterns of a user.

In one example embodiment, information may be derived for a plurality of users and the information may be aggregated based on demographics. For example, coffee consumption for a population based on user location or age group may be estimated by aggregating the power usage data and/or information derived from the power usage data for a plurality of coffee users. The power usage data may be the power consumed by, for example, a laptop computer that may indicate an amount of time spent by a user at the coffee house and thereby the amount of coffee consumed.

Figure 2:
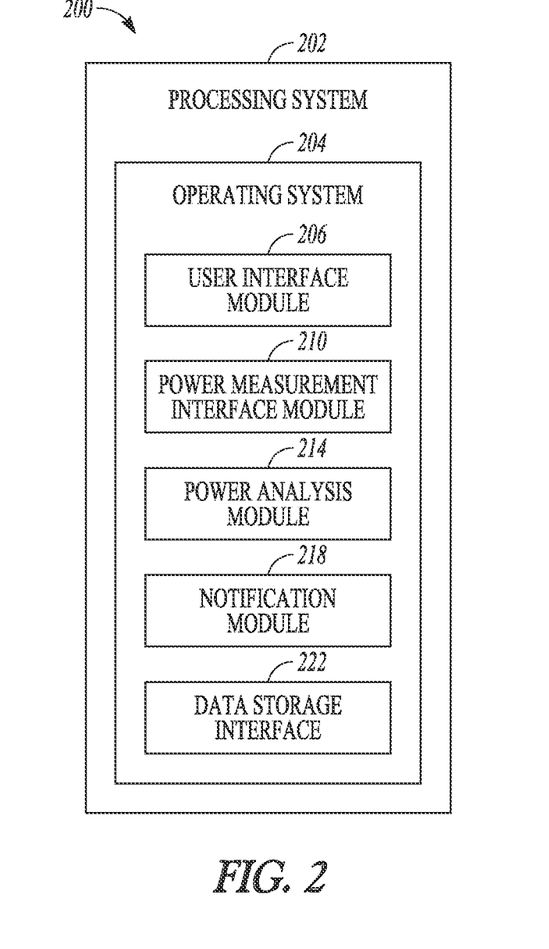
FIG. 2 is a block diagram of an example apparatus for monitoring the power consumption of a monitored element, in accordance with an example embodiment, in accordance with an example embodiment.

FIG. 2 is a block diagram of an example apparatus 200 for monitoring the power consumption of a monitored element 108, in accordance with an example embodiment. In one example embodiment, the apparatus 200 may serve as the power monitor 116. The apparatus 200 may derive ancillary information based on the monitored power usage of an element and may determine actions and/or recommendations based on the power usage and/or the ancillary information. The power monitor 116 is shown to include a processing system 202 that may be implemented on a server, client, or other processing device that includes an operating system 204 for executing software instructions. In accordance with an example embodiment, the power monitor 116 may include a user interface module 206, a power measurement interface module 210, a power analysis module 214, and a notification module 218. In accordance with an example embodiment, the apparatus 200 may include a data storage interface 222 for accessing data that may comprise, for example, a rules database for analyzing power usage.

The user interface module 206 provides an interface for entering rules for analyzing power usage, as described more fully below in conjunction with FIGS. 3 and 6A. The user interface module 206 also provides an interface for issuing notifications to a user, such as recommendations or suggested actions, as described more fully below in conjunction with FIG. 6B.

The power measurement interface module 210 exchanges information with the power measurement device 104. For example, the power measurement interface module 210 may submit power measurement requests to the power measurement device 104 and may obtain power measurement data from the power measurement device 104.

The power analysis module 214 analyzes power usage of the monitored element 108 to determine, infer and/or estimate ancillary information, such as user behavior, generates recommendations and/or identifies actions to be performed, and/or identifies the type of device that is consuming the power. In one example embodiment, the power analysis module 214 may trigger or execute the identified action(s).

The notification module 218 issues recommendations and/or triggers actions determined by the power analysis module 214. For example, the notification module 218 may issue a recommendation to a user via the user interface module 206 or may trigger an action, such as turning the power on for a coffee maker, by issuing a command via the network 112.

Figure 3:
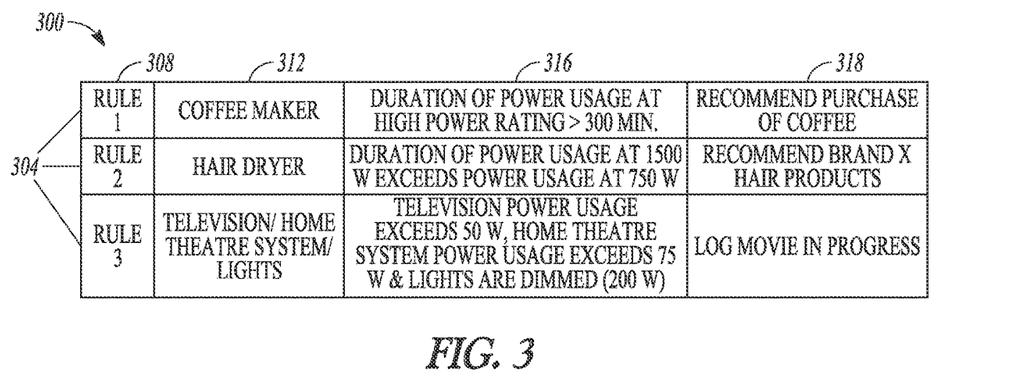
FIG. 3 is an example rule base data structure for determining actions and/or recommendations based on power usage, in accordance with an example embodiment.

FIG. 3 is an example rule base data structure 300 for determining actions and/or recommendations based on power usage and/or the ancillary information derived from the power usage, in accordance with an example embodiment. Each row 304 of the rule base data structure 300 may correspond to a rule for analyzing the power usage of the monitored element 108. Column 308 may be a rule identifier field, column 312 may identify the type of element (such as type of appliance), column 316 may define the conditions for applying the corresponding rule, and column 318 may define the recommendation to be issued and/or action to be performed.

Rule 1, for example, is directed to a coffee maker that utilizes two cycles: a high-powered brewing cycle and a low-powered warming cycle. In this case, knowing only the relative power consumption is sufficient to implement the rule; the exact power consumed by each cycle is not needed. In one example embodiment, the coffee machine is monitored and a usage of the coffee maker is analyzed to determine a user's behavior, such as how much coffee the user is consuming. From the amount of coffee consumed, a time for suggesting the purchase of coffee refills may be determined. As defined in Rule 1, if a duration of power usage at the higher power rating (indicative of the brewing cycle) exceeds 300 minutes, a recommendation to purchase coffee is issued. In addition, an increase in coffee consumption by a user may indicate personal stress and may indicate that stress reduction medications should be recommended or vacation opportunities should be presented to the user.

Rule 2 is directed to a hair dryer that utilizes two settings: a high temperature drying setting and a low temperature drying setting. In one example embodiment, the hair dryer is monitored and a usage of the hair dryer is analyzed to determine the user's behavior, such as whether the hair dryer is used more frequently on the high temperature setting or the low temperature setting. From the setting information, a recommendation for a suitable hair product(s) may be determined and presented to the user. For example, if a duration of power usage at 1500 Watts exceeds a power usage of 750 Watts, a recommendation to purchase brand X heat-tolerant hair products is issued.

In one example embodiment, user behavior may be inferred from analyzing the power usage of a plurality of elements. Rule 3, for example, is directed to analyzing the power usage of a television, a home theatre system, and lighting in a home theatre. For example, if the television power usage exceeds 50 watts, the home theatre system power usage exceeds 75 watts, and the lights are dimmed (i.e., power usage is approximately 200 watts), it is inferred that a movie is in progress. In another example, if the television power usage exceeds 50 watts and the home theatre system power usage is less than five watts (i.e., the home theatre system is not active), it is inferred that a television program other than a movie is in progress.

In one example embodiment, a water heating system is monitored and a power usage of the water heating system is analyzed to estimate the number of occupants of a residence and the number of showers and or baths taken by the occupants. In one example embodiment, 0.171 kilowatt hours (kWh) are consumed to heat one gallon of water from 50 degrees Fahrenheit to 120 degrees Fahrenheit. In addition, a bath may consume 12-15 gallons of hot water and a shower may consume 5-9 gallons of hot water. Based on this information, an approximate number of showers and/or baths taken may be estimated and, based on the estimate of showers and baths taken, a number of occupants of the residence may be estimated.

In one example embodiment, the usage of the water heating system is analyzed to determine if the water heater is working properly and efficiently based on the expected energy consumption by the water heater for a specified number of occupants of a residence. If the water heater is not working properly or efficiently (as indicated by the measured energy consumption exceeding the expected value), a service appointment and/or the replacement of one or more parts of the water heating system may be recommended.

In one example embodiment, a clothes washing machine and/or clothes dryer are monitored and a usage of the clothes washing machine and/or clothes dryer is analyzed to determine if a recommendation to purchase additional laundry supplies should be issued. For example, if the clothes washing machine has cycled on and off more than forty times, a recommendation to purchase additional laundry supplies may be issued. In addition, if the power usage of the clothes dryer exceeds a pre-defined time duration on a single occasion, a recommendation may be issued to suggest that fewer clothes be loaded into the dryer. Similarly, usage of a toaster could indicate that a recommendation to purchase additional bread products should be issued.

In one example embodiment, a lamp is monitored and a usage of the lamp is analyzed to determine user behavior. For example, a user's waking state or time, commute time, change of working shift, and the like may be determined from the power usage of the lamp.

In one example embodiment, the power usage of a television or lamp is analyzed to determine if the device is being used in violation of a security policy or a parental control mechanism. For example, the power usage of a television in a child's bedroom after 9 PM may indicate that the television is being used in violation of a parental rule. In one example embodiment, the parent is notified if the television is in use after 9 PM.

In one example embodiment, a kitchen blender is monitored and a usage of the kitchen blender is analyzed to determine the speed setting of the blender and the type of food being prepared. For example, the power signature of the blender may indicate a sequence of speed settings and the sequence of speed settings may indicate the particular type of food being prepared. In one example embodiment, a personal computer is monitored and a usage of the personal computer is analyzed to determine a time for recommending that the user of the personal computer take a break.

In one example embodiment, a television and/or set-top box is monitored and a usage of the television and/or set-top box is analyzed to determine user behavior. For example, the programs being watched (or skipped) and the commercials being watched (or ignored) may be determined from the television usage. In one example embodiment, a fluctuation in the power consumed by the set-top box may be indicative of a user changing channels and/or fast-forwarding a built-in digital video recorder (DVR). The fluctuations may also be indicative of the number of channels being changed (either up or down). In addition, a steady consumption of power for a specified time period, such as 30 or 60 minutes, may be indicative of the program in a programming schedule that is being viewed. For example, an analysis of the programming schedule may be performed to identify the program(s) that have the same duration as the steady power consumption and, therefore, the program(s) that may have been selected by the user.

It is also known that television viewers often bypass commercials. In one example embodiment, the changing of the channel on the set-top box or the fast-forwarding of a DVR by a user may be indicative of commercials being bypassed by the user; the time of the operation (i.e., the changing of the channel or the fast-forwarding of the DVR) may be compared to known commercial breaks occurring in specific programs to pinpoint which channel the user is watching.

In one example embodiment, a user's power utilization at a public venue is monitored. For example, a customer's power usage for a computer or cell phone at an airport or coffee house may be monitored and the duration and/or magnitude of the power consumed may be used to profile a user's behavior at the public location. As described above, the power usage of a plurality of users at the location may be aggregated to characterize the typical power usage at the location and the typical user behavior at the location. For example, the average amount of time that a typical user uses a computer at a coffee house may be determined and tracked over time to derive marketing information for the coffee house.

Figure 4A:
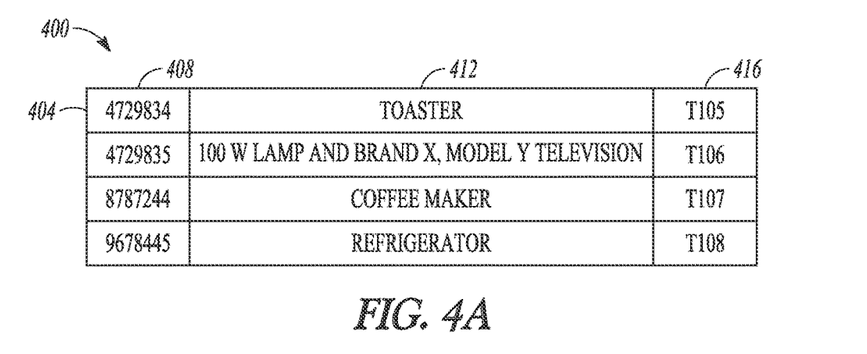
FIG. 4A is an example device identification data structure, in accordance with an example embodiment.

FIG. 4A is an example device identification data structure 400, in accordance with an example embodiment. Each row 404 of the device identification data structure 400 may correspond to and identify a power measurement device 104. Column 408 is a power measurement device identifier field comprising an identification number for the corresponding power measurement device 104, column 412 identifies the type of element(s) (such as type of appliance(s)) being monitored by the corresponding power measurement device 104, and column 416 identifies a table that maintains the power measurements for the corresponding power measurement device 104. For example, the power measurement device 104 with identifier 4729835 is monitoring a 100 watt lamp and a brand X, model Y television and the power measurements are stored in table T106.

Figure 4B:
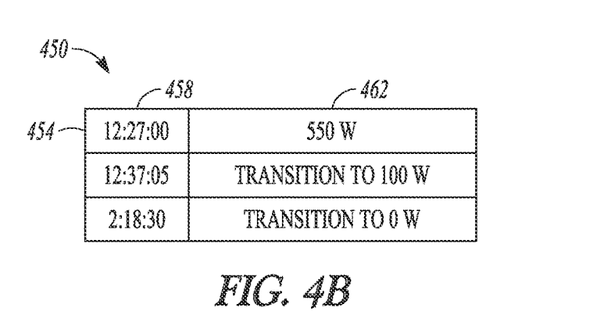
FIG. 4B is an example power measurement table for a corresponding power measurement device, in accordance with an example embodiment.

FIG. 4B is an example power measurement table 450 for a corresponding power measurement device 104, in accordance with an example embodiment. Each row 454 of the power measurement table 450 may correspond to a power measurement and/or power measurement transition. Column 458 corresponds to a time of a power measurement and/or power measurement transition and column 462 describes the power measurement and/or power measurement transition. For example, the power measurement table 450 shows that 550 watts was being consumed at 12:27:00 PM and a transition to 100 watts occurred at 12:37:05 PM.

Figure 5A:
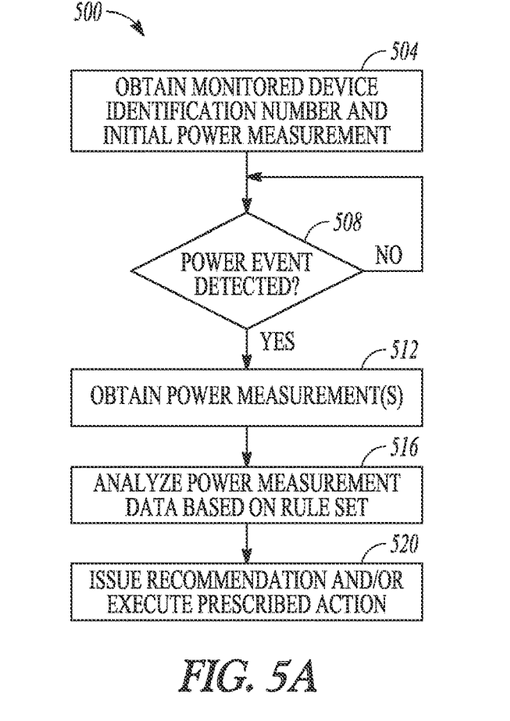
FIG. 5A is a flowchart for an example power usage analysis method for monitoring the power consumption of an element, deriving ancillary information based on the monitored power usage, and determining actions and/or recommendations based on the power usage and/or the ancillary information, in accordance with an example embodiment.

FIG. 5A is a flowchart for a power usage analysis method 500 for monitoring the power consumption of an element, deriving ancillary information based on the monitored power usage, and determining actions and/or recommendations based on the power usage and/or the ancillary information derived from the power usage, in accordance with an example embodiment. In one example embodiment, one or more of the operations of the power usage analysis method 500 may be performed by the power analysis module 214.

In one example embodiment, an identification number of the power measurement device 104 corresponding to the monitored element 108 is obtained and an initial power measurement(s) is obtained from the identified power measurement device 104 and stored as the parameter last_measured_value (operation 504). The initial power measurement(s) may also be stored in the corresponding power measurement table 450. The parameter last_measured_value may be a scalar value, such as current measured in amps, or may be a vector comprising one or more power measurement values, such as current measured in amps and voltage measured in volts. In one example embodiment, the power usage analysis method 500 waits for a power consumption event, such as a change in the power measurement, to occur before proceeding to operation 512. In one example embodiment, the power usage analysis method 500 may proceed to operation 516 without waiting for the occurrence of a power consumption event.

In one example embodiment, a test is performed to determine if a power consumption event is detected (operation 508). In one example embodiment, the power consumption event may be a trigger from a power measurement timer, an occurrence of a scheduled measurement event, a reception of a measurement request, a detection of a substantial change in power consumption, and the like. For example, a power consumption event may occur if the measured current changes from zero amps to two amps.

In one example embodiment, if a power consumption event is not detected, the power usage analysis method 500 repeats operation 508; if a power consumption event is detected, one or more power measurements are obtained from the power measurement device 104 and stored as the parameter last_measured_value (operation 512). The obtained power measurement(s) may also be stored in the corresponding power measurement table 450. As described above, the parameter last_measured_value may be a scalar value, such as current measured in amps, or may be a vector comprising one or more power measurement values, such as current measured in amps and voltage measured in volts.

In one example embodiment, the parameter last_measured_value is processed based, for example, on one or more of the rules in the rule base data structure 300. In processing the parameter last_measured_value, power measurement data stored in the corresponding power measurement table 450 may be accessed and utilized in the analysis. Based on the analysis of the power measurement data, one or more actions and/or recommendations are determined (operation 516). For example, if a clothes washing machine has cycled on and off more than forty times, a recommendation to purchase additional laundry supplies may be determined.

In one example embodiment, one or more of the determined actions and/or recommendations are issued in a notification (operation 520). For example, a notification may be issued via the notification module 218 to a mobile device of a user indicating that additional laundry detergents may be needed.

Figure 5B:
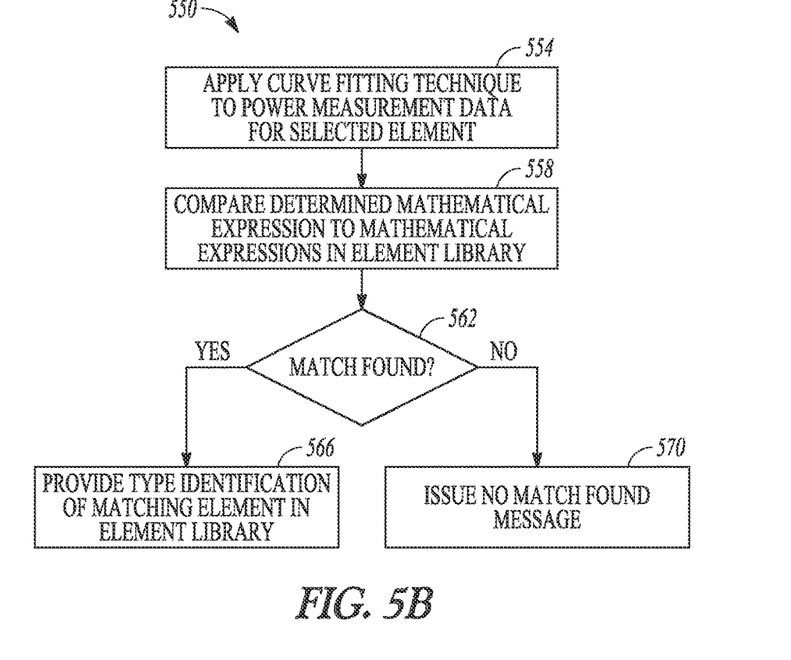
FIG. 5B is a flowchart for an example method for analyzing a power signature of a monitored element, in accordance with an example embodiment.

FIG. 5B is a flowchart for a method 550 for analyzing a power signature of a monitored element 108, in accordance with an example embodiment. In one example embodiment, one or more of the operations of the power usage analysis method 550 may be performed by the power analysis module 214.

In one example embodiment, power measurement information for the monitored element 108, such as the power measurement information maintained in a corresponding power measurement table 450, may be processed to generate an element power signature (operation 554). For example, a curve fitting algorithm may be used to mathematically characterize the power measurement information and may derive a mathematical expression, such as a mathematical formula or function, that characterizes the power consumption of the monitored element 108.

The mathematical characterization of the element's power signature may be compared to a library of power signatures of a variety of elements, such as computers, home appliances, and the like (operation 558). A test is performed to determine if a matching power signature was found (operation 562). If a matching power signature was found, the type of element identified in the library is assigned to the element being monitored (operation 566). If a matching device power signature is not found, an error message, such as a "no match found" message, is returned (operation 570).

Figure 6A:
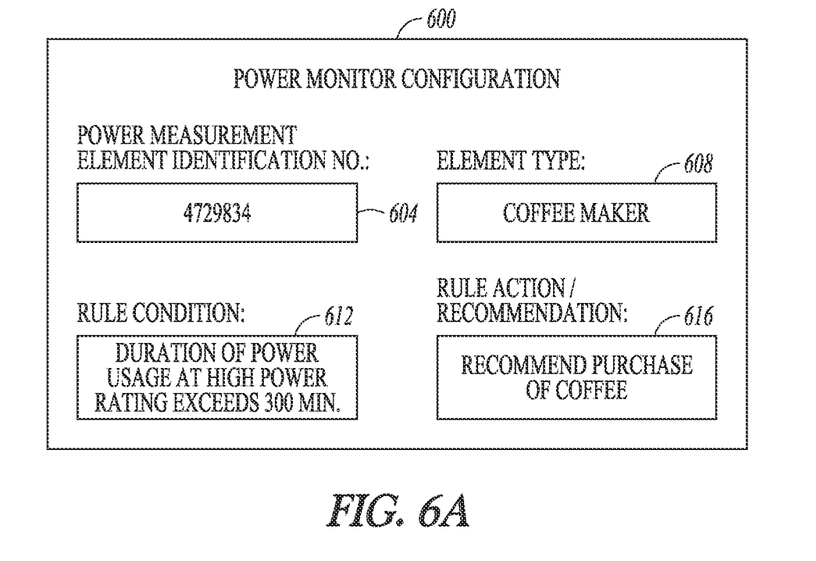
FIG. 6A is an example user interface for entering rules into a rule base data structure utilized for analyzing power usage, in accordance with an example embodiment.

FIG. 6A is an example user interface 600 for entering rules into the rule base data structure 300, in accordance with an example embodiment. A power measurement device identifier of a selected power measurement device 104 may be entered in the power measurement element identification field 604 and the type of element(s) being monitored may be entered in the element type field 608. For example, the power measurement device identifier 4729834 may be entered in the power measurement element identification field 604 and the appliance type "coffee maker" may be entered in the element type field 608. In one example embodiment, the element type may be automatically identified by analyzing a power signature of the element, as described more fully above in conjunction with FIG. 5B.

One or more rule conditions may be entered in the rule condition field 612 and one or more rule actions and/or recommendations may be entered in the rule action/recommendation field 616. For example, the rule condition may be that the duration of power usage at a high power rating exceeds 300 minutes and the corresponding recommendation may be to purchase coffee.

Figure 6B:
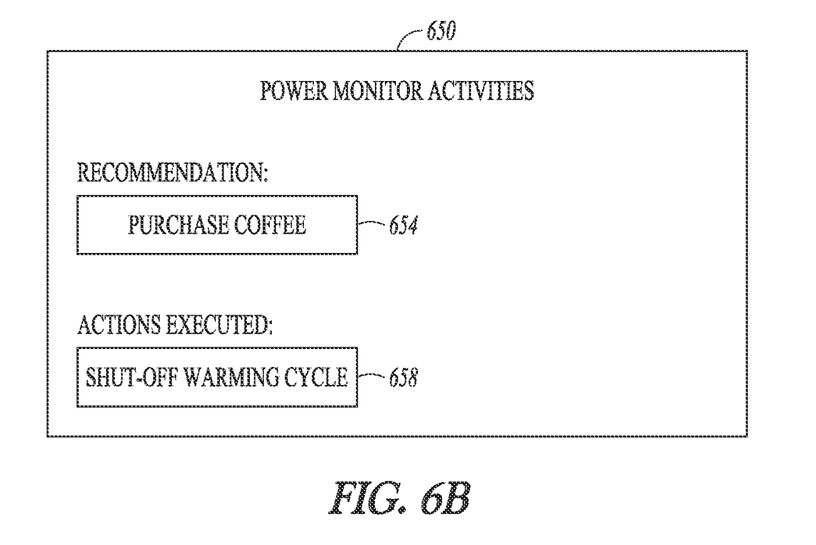
FIG. 6B is an example user interface for displaying notifications generated by analyzing the power usage of a monitored element, in accordance with an example embodiment.

FIG. 6B is an example user interface 650 for displaying notifications generated by analyzing the power usage of the monitored element 108, in accordance with an example embodiment. The notifications may include recommendations 654 that have been issued and/or actions 658 that have been executed as a result of the power usage analysis. For example, a recommendation may be to purchase coffee and an action may be to shut-off a warming cycle.

Although certain examples are shown and described here, other variations exist and are within the scope of the invention. It will be appreciated, by those of ordinary skill in the art, that any arrangement, which is designed or arranged to achieve the same purpose, may be substituted for the specific embodiments shown. This application is intended to cover any adaptations or variations of the example embodiments of the invention described herein. It is intended that this invention be limited only by the claims, and the full scope of equivalents thereof.

Example Mobile Device

Figure 7:
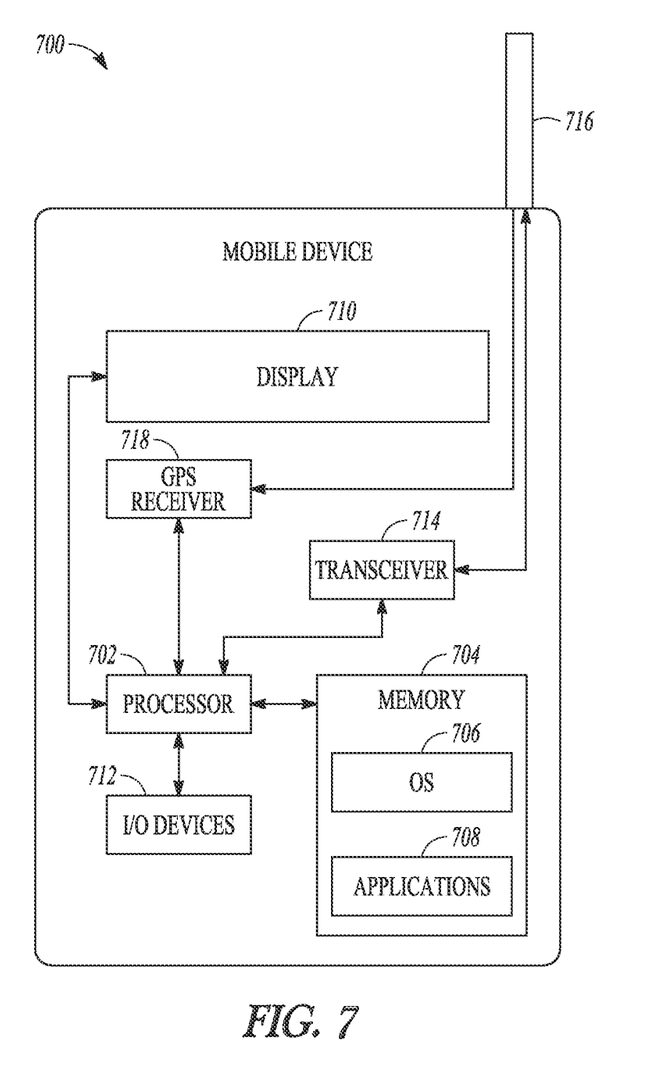
FIG. 7 is a block diagram illustrating an example mobile device, according to an example embodiment.

FIG. 7 is a block diagram illustrating an example mobile device 700, according to an example embodiment. The mobile device 700 may include a processor 702. The processor 702 may be any of a variety of different types of commercially available processors suitable for mobile devices (for example, an XScale architecture microprocessor, a microprocessor without interlocked pipeline stages (MIPS) architecture processor, or another type of processor 702). A memory 704, such as a random access memory (RAM), a flash memory, or other type of memory, is typically accessible to the processor 702. The memory 704 may be adapted to store an operating system (OS) 706, as well as application programs 708, such as a mobile location enabled application that may provide LBSs to a user. The processor 702 may be coupled, either directly or via appropriate intermediary hardware, to a display 710 and to one or more input/output (I/O) devices 712, such as a keypad, a touch panel sensor, a microphone, and the like. Similarly, in some embodiments, the processor 702 may be coupled to a transceiver 714 that interfaces with an antenna 716. The transceiver 714 may be configured to both transmit and receive cellular network signals, wireless data signals, or other types of signals via the antenna 716, depending on the nature of the mobile device 700. Further, in some configurations, a GPS receiver 718 may also make use of the antenna 716 to receive GPS signals.

Modules, Components and Logic

Certain embodiments are described herein as including logic or a number of components, modules, or mechanisms. Modules may constitute either software modules (e.g., code embodied (1) on a non-transitory machine-readable medium or (2) in a transmission signal) or hardware-implemented modules. A hardware-implemented module is a tangible unit capable of performing certain operations and may be configured or arranged in a certain manner. In example embodiments, one or more computer systems (e.g., a standalone, client or server computer system) or one or more processors may be configured by software (e.g., an application or application portion) as a hardware-implemented module that operates to perform certain operations as described herein.

In various embodiments, a hardware-implemented module may be implemented mechanically or electronically. For example, a hardware-implemented module may comprise dedicated circuitry or logic that is permanently configured (e.g., as a special-purpose processor, such as a field programmable gate array (FPGA) or an application-specific integrated circuit (ASIC)) to perform certain operations. A hardware-implemented module may also comprise programmable logic or circuitry (e.g., as encompassed within a general-purpose processor or other programmable processor) that is temporarily configured by software to perform certain operations. It will be appreciated that the decision to implement a hardware-implemented module mechanically, in dedicated and permanently configured circuitry, or in temporarily configured circuitry (e.g., configured by software) may be driven by cost and time considerations.

Accordingly, the term "hardware-implemented module" should be understood to encompass a tangible entity, be that an entity that is physically constructed, permanently configured (e.g., hardwired) or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules can provide information to, and receive information from, other hardware-implemented modules. Accordingly, the described hardware-implemented modules may be regarded as being communicatively coupled. Where multiples of such hardware-implemented modules exist contemporaneously, communications may be achieved through signal transmission (e.g., over appropriate circuits and buses that connect the hardware-implemented modules). In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation and store the output of that operation in a memory device to which it is communicatively coupled. A further hardware-implemented module may then, at a later time, access the memory device to retrieve and process the stored output. Hardware-implemented modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

Electronic Apparatus and System

Example embodiments may be implemented in digital electronic circuitry, or in computer hardware, firmware, software, or in combinations of them. Example embodiments may be implemented using a computer program product, e.g., a computer program tangibly embodied in an information carrier, e.g., in a machine-readable medium for execution by, or to control the operation of data processing apparatus, e.g., a programmable processor, a computer, or multiple computers.

A computer program can be written in any form of programming language, including compiled or interpreted languages, and it can be deployed in any form, including as a stand-alone program or as a module, subroutine, or other unit suitable for use in a computing environment. A computer program can be deployed to be executed on one computer or on multiple computers at one site or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry, e.g., a field programmable gate array (FPGA) or an application-specific integrated circuit (ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures require consideration. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware may be a design choice. Below are set out hardware (e.g., machine) and software architectures that may be deployed, in various example embodiments.

Example Machine Architecture and Machine-Readable Medium

Figure 8:
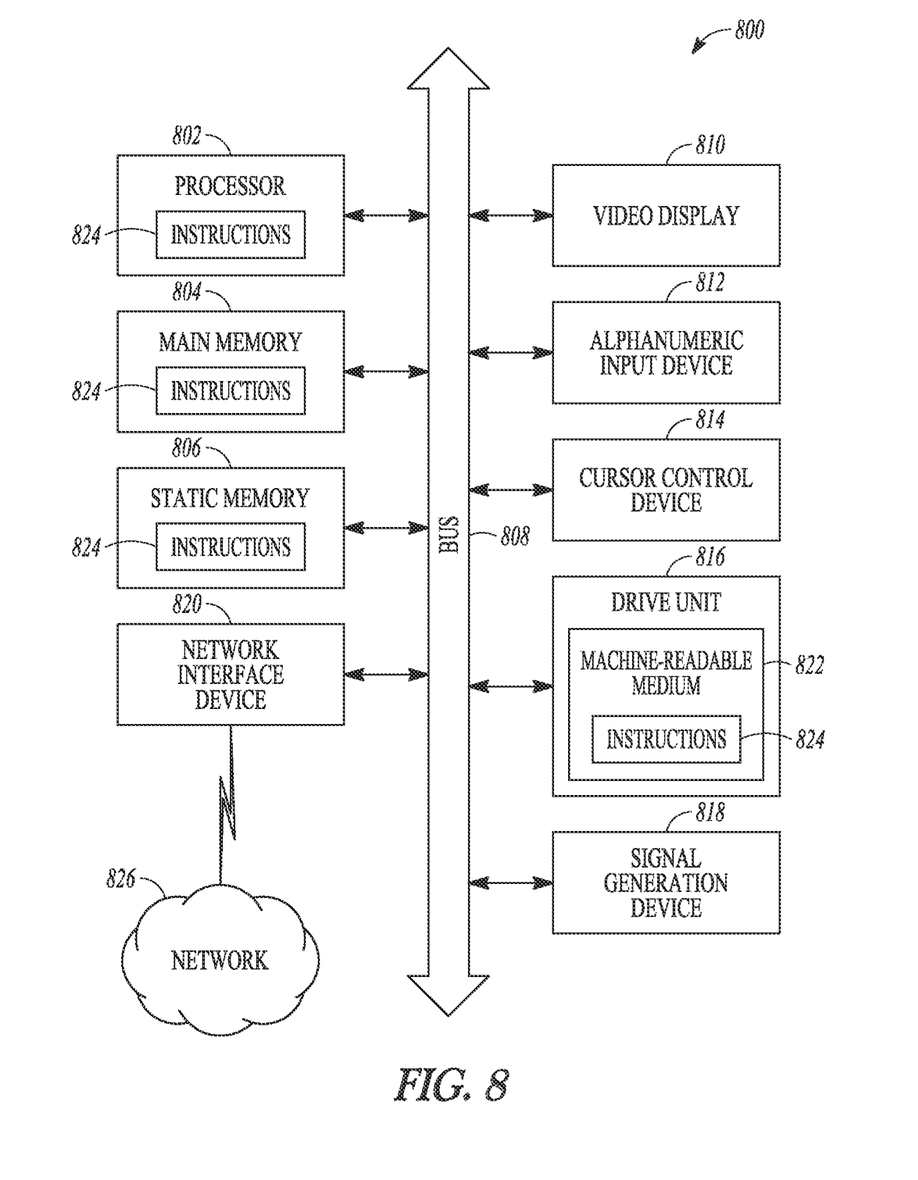
FIG. 8 is a block diagram of a machine within which instructions may be executed for causing the machine to perform any one or more of the methodologies discussed herein.

FIG. 8 is a block diagram of a machine within which instructions may be executed for causing the machine to perform any one or more of the methodologies discussed herein. In one example embodiment, the machine may be the example apparatus 200 of FIG. 2 for monitoring power consumption of an element and deriving ancillary information based on the monitored power usage. In alternative embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be a personal computer (PC), a tablet PC, a set-top box (STB), a personal digital assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 800 includes a processor 802 (e.g., a central processing unit (CPU), a graphics processing unit (GPU) or both), a main memory 804 and a static memory 806, which communicate with each other via a bus 808. The computer system 800 may further include a video display unit 810 (e.g., a liquid crystal display (LCD) or a cathode ray tube (CRT)). The computer system 800 also includes an alphanumeric input device 812 (e.g., a keyboard), a user interface (UI) navigation (or cursor control) device 814 (e.g., a mouse), a disk drive unit 816, a signal generation device 818 (e.g., a speaker) and a network interface device 820.

Machine-Readable Medium

The drive unit 816 includes a machine-readable medium 822 on which is stored one or more sets of data structures and instructions 824 (e.g., software) embodying or utilized by any one or more of the methodologies or functions described herein. The instructions 824 may also reside, completely or at least partially, within the main memory 804 and/or within the processor 802 during execution thereof by the computer system 800, the main memory 804 and the processor 802 also constituting machine-readable media 822. Instructions 824 may also reside within the static memory 806.

While the machine-readable medium 822 is shown in an example embodiment to be a single medium, the term "machine-readable medium" may include a single medium or multiple media (e.g., a centralized or distributed database, and/or associated caches and servers) that store the one or more data structures or instructions 824. The term "machine-readable medium" shall also be taken to include any tangible medium that is capable of storing, encoding or carrying instructions 824 for execution by the machine and that cause the machine to perform any one or more of the methodologies of the present invention, or that is capable of storing, encoding or carrying data structures utilized by or associated with such instructions 824. The term "machine-readable medium" shall accordingly be taken to include, but not be limited to, solid-state memories, and optical and magnetic media. Specific examples of machine-readable media 822 include non-volatile memory, including by way of example semiconductor memory devices, e.g., erasable programmable read-only memory (EPROM), electrically erasable programmable read-only memory (EEPROM), and flash memory devices; magnetic disks such as internal hard disks and removable disks; magneto-optical disks; and CD-ROM and DVD-ROM disks.

Transmission Medium

The instructions 824 may further be transmitted or received over a communications network 826 using a transmission medium. The instructions 824 may be transmitted using the network interface device 820 and any one of a number of well-known transfer protocols (e.g., hypertext transfer protocol (HTTP)). Examples of communications networks 826 include a local area network ("LAN"), a wide area network ("WAN"), the Internet, mobile telephone networks, plain old telephone (POTS) networks, and wireless data networks (e.g., WiFi and WiMax networks). The term "transmission medium" shall be taken to include any intangible medium that is capable of storing, encoding or carrying instructions 824 for execution by the machine, and includes digital or analog communications signals or other intangible media to facilitate communication of such instructions 824.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method comprising:
   receiving, by a hardware-based power measurement device implemented on a server, a power usage measurement;
   using, by a processor, a curve fitting algorithm to generate a mathematical formula that characterizes the power usage measurement;
   identifying, by the processor, an element based on the mathematical formula generated by the curve fitting algorithm, the identifying of the element including matching a power signature associated with the mathematical formula with a plurality of power signatures associated with a plurality of elements;

determining, by the processor, a user behavior associated with the element based at least on an analysis of the power usage measurement; and based on a determined user behavior, causing, by the processor, the element to perform an action that affects a power function of the element.

2. The method of claim 1, wherein the power signature is a first power signature, further comprising:

accessing power signature data associated with the plurality of elements, the power signature data describing the plurality of power signatures associated with the plurality of elements;

matching the first power signature with a second power signature from the plurality of power signatures; and identifying the element based on the matching of the first power signature with the second power signature.

3. The method of claim 1, further comprising:

based on the determined user behavior, causing display of a notification corresponding to a suggestion of the action that affects the power function of the element.

4. The method of claim 3, wherein the action is an increase of a supply for the element.

5. The method of claim 1, wherein the power usage measurement is determined based on one of: a time of use, a frequency of use, a duration of use, or a magnitude of power consumed.

6. The method of claim 1, wherein the hardware-based power measurement device is coupled to a power plug or a power cord.

7. The method of claim 1, wherein the element is a component, a device, an appliance, a system, or a combination of one or more of the component, the device, the appliance, and the system.

8. The method of claim 1, further comprising:

based on the determined user behavior, determining an item for purchase;

generating a recommendation based on the item for purchase; and causing display of the recommendation on a user interface of a device.

9. A system comprising:

a processor; and a memory including instructions that, when executed by the processor, cause the processor to perform operations comprising:

receiving, by a hardware-based power measurement device implemented on a server, a power usage measurement;

using, by a processor, a curve fitting algorithm to generate a mathematical formula that characterizes the power usage measurement;

identifying, by the processor, an element based on the mathematical formula generated by the curve fitting algorithm, the identifying of the element including matching a power signature associated with the mathematical formula with a plurality of power signatures associated with a plurality of elements;

determining, by the processor, a user behavior associated with the element based at least on an analysis of the power usage measurement; and based on a determined user behavior, causing, by the processor, the element to perform an action that affects a power function of the element.

10. The system of claim 9, wherein the power signature is a first power signature, further comprising:

accessing power signature data associated with the plurality of elements, the power signature data describing the plurality of power signatures associated with the plurality of elements;

matching the first power signature with a second power signature from the plurality of power signatures; and identifying the element based on the matching of the first power signature with the second power signature.

11. The system of claim 9, further comprising:

based on the determined user behavior, causing display of a notification corresponding to a suggestion of the action that affects the power function of the element.

12. The system of claim 11, wherein the action is an increase of a supply for the element.

13. The system of claim 9, wherein the power usage measurement is determined based on one of: a time of use, a frequency of use, a duration of use, or a magnitude of power consumed.

14. The system of claim 9, wherein the hardware-based power measurement device is coupled to a power plug or a power cord.

15. The system of claim 9, wherein the element is a component, a device, an appliance, a system, or a combination of one or more of the component, the device, the appliance, and the system.

16. The system of claim 9, further comprising:

based on the determined user behavior, determining an item for purchase;

generating a recommendation based on the item for purchase; and causing display of the recommendation on a user interface of a device.

17. A non-transitory computer-readable medium comprising instructions, which when executed by a processor, cause the processor to perform operations comprising:

receiving, by a hardware-based power measurement device implemented on a server, a power usage measurement;

using, by a processor, a curve fitting algorithm to generate a mathematical formula that characterizes the power usage measurement;

identifying, by the processor, an element based on the mathematical formula generated by the curve fitting algorithm, the identifying of the element including matching a power signature associated with the mathematical formula with a plurality of power signatures associated with a plurality of elements;

determining, by the processor, a user behavior associated with the element based at least on an analysis of the power usage measurement; and based on a determined user behavior, causing, by the processor, the element to perform an action that affects a power function of the element.

18. The non-transitory computer-readable medium of claim 17, wherein the operations further comprise:

based on the determined user behavior, causing display of a notification corresponding to a suggestion of the action that affects the power function of the element.

* * * * *